(12) United States Patent
Mimura et al.

(10) Patent No.: US 11,606,077 B2
(45) Date of Patent: Mar. 14, 2023

(54) ELASTIC WAVE DEVICE, RADIO-FREQUENCY FRONT-END CIRCUIT, AND COMMUNICATION APPARATUS

(71) Applicant: Murata Manufacturing Co., Ltd., Nagaokakyo (JP)

(72) Inventors: Masakazu Mimura, Nagaokakyo (JP); Yutaka Kishimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1249 days.

(21) Appl. No.: 16/101,572

(22) Filed: Aug. 13, 2018

(65) Prior Publication Data

US 2019/0074814 A1     Mar. 7, 2019

(30) Foreign Application Priority Data

Sep. 4, 2017   (JP) .............................. JP2017-169206

(51) Int. Cl.
| | |
|---|---|
| *H03H 9/02* | (2006.01) |
| *H03H 9/17* | (2006.01) |
| *H03H 3/08* | (2006.01) |
| *H03H 9/25* | (2006.01) |
| *H03H 9/64* | (2006.01) |

(52) U.S. Cl.
CPC .......... *H03H 9/02574* (2013.01); *H03H 3/08* (2013.01); *H03H 9/02086* (2013.01); *H03H 9/02157* (2013.01); *H03H 9/02228* (2013.01); *H03H 9/175* (2013.01); *H03H 9/25* (2013.01); *H03H 9/6453* (2013.01)

(58) Field of Classification Search
CPC ............................ H03H 9/02574; H03H 3/08

USPC ........ 310/313 R, 13 A, 313 B, 313 C, 313 D
See application file for complete search history.

(56) References Cited

U.S. PATENT DOCUMENTS

| | | | |
|---|---|---|---|
| 2004/0189425 A1* | 9/2004 | Iwashita | ............ H03H 9/02574 331/116 R |
| 2014/0152146 A1* | 6/2014 | Kimura | .............. H03H 9/02228 29/25.35 |
| 2014/0225684 A1 | 8/2014 | Kando et al. | |

(Continued)

FOREIGN PATENT DOCUMENTS

| | | |
|---|---|---|
| JP | 2008-501248 A | 1/2008 |
| KR | 10-2014-0101773 A | 8/2014 |
| WO | 2005/096494 A1 | 10/2005 |

(Continued)

*Primary Examiner* — Derek J Rosenau
(74) *Attorney, Agent, or Firm* — Keating & Bennett, LLP

(57) ABSTRACT

An elastic wave device includes a supporting substrate, an acoustic reflection layer on the supporting substrate, a piezoelectric layer on the acoustic reflection layer, and an IDT electrode on the piezoelectric layer. The acoustic reflection layer includes three or more low-acoustic impedance layers and two or more high-acoustic impedance layers. At least one of a first relationship in which in which, a film thickness of a first low-acoustic impedance layer closest to the piezoelectric layer is thinner than a film thickness of a low-acoustic impedance layer closest to the first low-acoustic impedance layer, and a second relationship in which a film thickness of a first high-acoustic impedance layer closest to the piezoelectric layer is thinner than a film thickness of a high-acoustic impedance layer closest to the first high-acoustic impedance layer, is satisfied.

18 Claims, 6 Drawing Sheets

(56) References Cited

U.S. PATENT DOCUMENTS

2014/0312994 A1* 10/2014 Meltaus ............ H03H 9/02086
333/187

FOREIGN PATENT DOCUMENTS

WO 2012/086441 A1 6/2012
WO 2013/061926 A1 5/2013

* cited by examiner

ELASTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2017-169206 filed on Sep. 4, 2017. The entire contents of this application are hereby incorporated herein by reference.

BACKGROUND OF THE INVENTION

1. Field of the Invention

The present invention relates to an elastic wave device, a radio-frequency (RF) front-end circuit, and a communication apparatus.

2. Description of the Related Art

Elastic wave devices have been widely used in filters of cellular phones. International Publication No. WO 2012/086441 discloses an example of an elastic wave device. This elastic wave device includes an acoustic reflection layer provided between a supporting substrate and a piezoelectric layer. In the acoustic reflection layer, low-acoustic impedance layers and high-acoustic impedance layers are alternately laminated. The elastic wave device disclosed in International Publication No. WO 2012/086441 uses plate waves such as the $S_0$ mode as the main mode. The film thickness of the low-acoustic impedance layers is equal to the film thickness of the high-acoustic impedance layers.

In the elastic wave device described in International Publication No. WO 2012/086441, there is a tendency that a large spurious emission occurs around the frequency of the main mode. Therefore, the spurious emission may affect the filter characteristics of the elastic wave device.

SUMMARY OF THE INVENTION

Preferred embodiments of the present invention provide elastic wave devices, RF front-end circuits, and communication apparatuses capable of increasing the difference between the frequency of the main mode and a frequency at which a spurious emission occurs.

According to a preferred embodiment of the present invention, an elastic wave device includes a supporting substrate; an acoustic reflection layer provided on the supporting substrate; a piezoelectric layer provided on the acoustic reflection layer; and an interdigital transducer (IDT) electrode provided on the piezoelectric layer. The acoustic reflection layer includes three or more low-acoustic impedance layers; and two or more high-acoustic impedance layers. At least one of a first relationship in which a film thickness of, among the three or more low-acoustic impedance layers, a first low-acoustic impedance layer closest to the piezoelectric layer is thinner than a film thickness of a low-acoustic impedance layer closest to the first low-acoustic impedance layer among the three or more low-acoustic impedance layers or a second relationship in which a film thickness of, among the two or more high-acoustic impedance layers, a first high-acoustic impedance layer closest to the piezoelectric layer is thinner than a film thickness of a high-acoustic impedance layer closest to the first high-acoustic impedance layer among the two or more high-acoustic impedance layers, is satisfied.

In an elastic wave device according to a preferred embodiment of the present invention, the three or more low-acoustic impedance layers and the two or more high-acoustic impedance layers are alternately laminated. In this case, because the reflectance at the acoustic reflection layer is further increased, a loss is able to be further reduced.

In an elastic wave device according to a preferred embodiment of the present invention, the first low-acoustic impedance layer is closest to the piezoelectric layer, and a film thickness of the first low-acoustic impedance layer is thinner than a film thickness of all the other low-acoustic impedance layers. In this case, the difference between the frequency of the main mode and a frequency at which a spurious emission occurs is further increased without greatly affecting the characteristics of the main mode.

In an elastic wave device according to a preferred embodiment of the present invention, a film thickness of the first low-acoustic impedance layer is thinner than a film thickness of all other low-acoustic impedance layers, and a film thickness of the first high-acoustic impedance layer is thinner than a film thickness of all other high-acoustic impedance layers. In this case, the difference between the frequency of the main mode and a frequency at which a spurious emission occurs is further increased without greatly affecting the characteristics of the main mode.

In an elastic wave device according to a preferred embodiment of the present invention, a plate wave in $S_0$ mode is used.

According to a preferred embodiment of the present invention, a radio-frequency (RF) front-end circuit includes an elastic wave device according to a preferred embodiment of the present invention; and a power amplifier.

According to a preferred embodiment of the present invention, a communication apparatus incudes a radio-frequency (RF) front-end circuit according to a preferred embodiment of the present invention; and an RF signal processing circuit.

According to preferred embodiments of the present invention, elastic wave devices, RF front-end circuits, and communication apparatuses capable of increasing the difference between the frequency of the main mode and a frequency at which a spurious emission occurs are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described with reference to the drawings.

Preferred embodiments described in the present specification are exemplary and it shall be noted that a partial replacement or combination of configurations in different preferred embodiments is possible.

Figure 1:
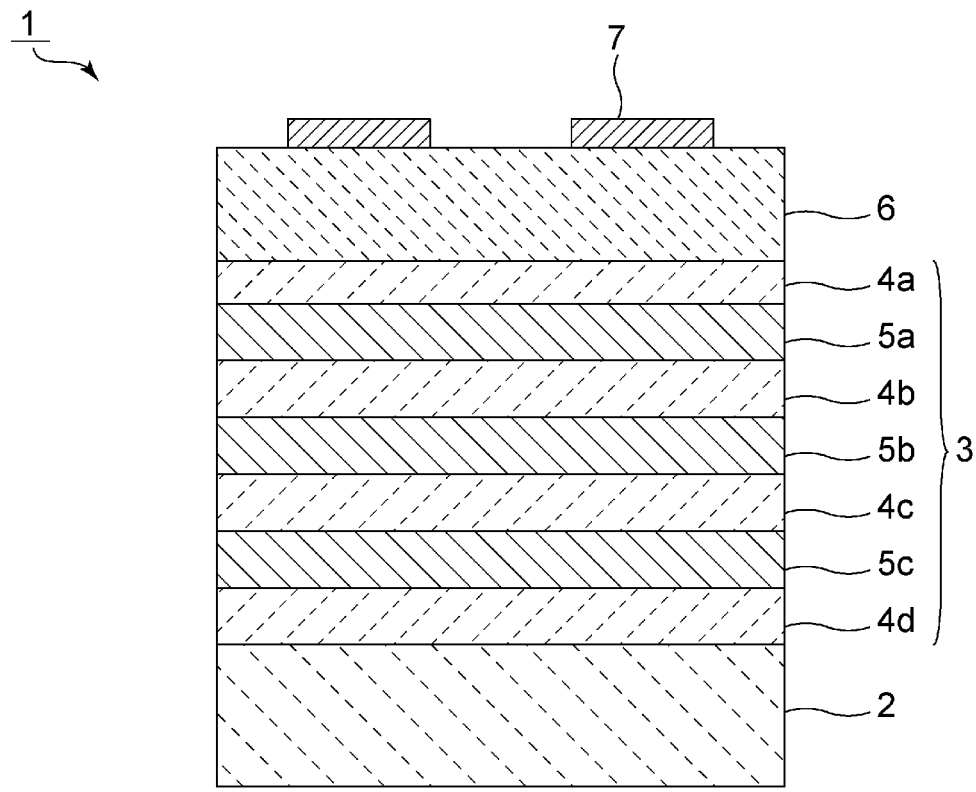
FIG. 1 is a front cross-section of an elastic wave device according to a first preferred embodiment of the present invention.

FIG. 1 is a front cross-section of an elastic wave device according to a first preferred embodiment of the present invention.

An elastic wave device 1 includes a supporting substrate 2. The supporting substrate 2 is preferably made of silicon (Si) in the present preferred embodiment, although there is no particular restriction on the material of the supporting substrate 2.

An acoustic reflection layer 3 is provided on the supporting substrate 2. A piezoelectric layer 6 is provided on the acoustic reflection layer 3. An interdigital transducer (IDT) electrode 7 is provided on the piezoelectric layer 6. Elastic waves are excited in response to application of an alternating-current (AC) voltage to the IDT electrode 7. The acoustic reflection layer 3 reflects elastic waves toward the piezoelectric layer 6 side, and confines plate waves toward the piezoelectric layer 6 side. Note that an intermediate layer made of titanium, nickel, or other suitable material, for example, may be provided between the piezoelectric layer 6 and the acoustic reflection layer 3. In addition, an intermediate layer made of titanium, nickel, or other suitable material may be provided between the acoustic reflection layer 3 and the supporting substrate 2. Furthermore, the IDT electrode 7 may be indirectly provided on the piezoelectric layer 6 with a silicon oxide film or other suitable film interposed therebetween.

The acoustic reflection layer 3 includes a plurality of low-acoustic impedance layers whose acoustic impedance is relatively low and a plurality of high-acoustic impedance layers whose acoustic impedance is relatively high. In the present preferred embodiment, the acoustic reflection layer 3 is preferably, for example, a laminated film in which low-acoustic impedance layers and high-acoustic impedance layers are alternately laminated.

Note that an intermediate layer made of titanium, nickel, or other suitable material may be provided between a low-acoustic impedance layer and a high-acoustic impedance layer.

The acoustic reflection layer 3 in the elastic wave device 1 preferably includes, as the plurality of low-acoustic impedance layers, for example, four low-acoustic impedance layers, namely, a low-acoustic impedance layer 4a, a low-acoustic impedance layer 4b, a low-acoustic impedance layer 4c, and a low-acoustic impedance layer 4d. The acoustic reflection layer 3 preferably includes, as the plurality of high-acoustic impedance layers, for example, three high-acoustic impedance layers, namely, a high-acoustic impedance layer 5a, a high-acoustic impedance layer 5b, and a high-acoustic impedance layer 5c.

In the present preferred embodiment, the low-acoustic impedance layer 4a, the low-acoustic impedance layer 4b, the low-acoustic impedance layer 4c, and the low-acoustic impedance layer 4d are preferably made of silicon oxide, for example. Silicon oxide is represented by $SiO_x$ (x is a real number). In the present preferred embodiment, each low-acoustic impedance layer is made of $SiO_2$, although there is no particular restriction on the value of x. Note that the material of the plurality of low-acoustic impedance layers is not limited to that described above, and may be any material with a relatively low acoustic impedance.

In contrast, the high-acoustic impedance layer 5a, the high-acoustic impedance layer 5b, and the high-acoustic impedance layer 5c are made of platinum (Pt). Note that the material of the plurality of high-acoustic impedance layers is not limited to that described above, and may be any material with a relatively high acoustic impedance.

Among the plurality of low-acoustic impedance layers in the acoustic reflection layer 3, a layer positioned nearest to the piezoelectric layer 6 is the low-acoustic impedance layer 4a. Among the plurality of high-acoustic impedance layers in the acoustic reflection layer 3, a layer positioned nearest to the piezoelectric layer 6 is the high-acoustic impedance layer 5a.

Here, the acoustic reflection layer 3 preferably only includes at least three or more low-acoustic impedance layers and at least two or more high-acoustic impedance layers. Because the total number of layers of the plurality of low-acoustic impedance layers and the plurality of high-acoustic impedance layers in the acoustic reflection layer 3 is five or more layers, for example, elastic waves are effectively confined toward the piezoelectric layer 6 side. Therefore, the reflectance at the acoustic reflection layer 3 is increased to reduce a loss.

Because the reflectance at the acoustic reflection layer 3 is able to be further increased by configuring five acoustic impedance layers including the three low-acoustic impedance layers and the two high-acoustic impedance layers by alternately laminating low-acoustic impedance layers and high-acoustic impedance layers, a loss is able to be further reduced.

In the present preferred embodiment, the number of low-acoustic impedance layers is preferably greater than the number of high-acoustic impedance layers in the acoustic reflection layer 3. Therefore, the low-acoustic impedance layer 4a is positioned nearest to the piezoelectric layer 6, and the low-acoustic impedance layer 4d is positioned nearest to the supporting substrate 2. Because the low-acoustic impedance layer 4a and the low-acoustic impedance layer 4d are made of silicon oxide in the present preferred embodiment, the frequency temperature characteristics are able to be improved, and the supporting substrate 2 and the acoustic reflection layer 3 are able to be easily joined together. Note that the acoustic reflection layer 3 is not limited to a configuration in which the number of low-acoustic impedance layers is greater than the number of high-acoustic impedance layers.

The film thickness of the low-acoustic impedance layer 4a is preferably thinner than the film thickness of the low-acoustic impedance layer 4b, the low-acoustic impedance layer 4c, and the low-acoustic impedance layer 4d. Note that the low-acoustic impedance layer 4b, the low-acoustic impedance layer 4c, and the low-acoustic impedance layer 4d preferably have the same or substantially the same film thickness. In contrast, the high-acoustic impedance layer 5a, the high-acoustic impedance layer 5b, and the high-acoustic impedance layer 5c all preferably have the same or substantially the same film thickness in the present preferred embodiment. Here, having the same film thickness in the present specification indicates that the film thickness is substantially the same to the extent that the filter characteristics of the elastic wave device are not impaired. Each low-acoustic impedance layer is not necessarily a single layer, but may be a multilayer structure having a plurality of layers made of a material with a relatively low acoustic impedance. In addition, each low-acoustic impedance layer may be a multilayer structure including an intermediate layer made of titanium, nickel, or other suitable material between layers. It is assumed that the film thickness of a low-acoustic impedance layer indicates the film thickness of the entire multilayer structure. Similarly, each high-acoustic impedance layer is not necessarily a single layer, but may be a multilayer structure including a plurality of layers made of a material with a relatively high acoustic impedance. In addition, each high-acoustic impedance layer may be a multilayer structure including an intermediate layer made of titanium, nickel, or other suitable material between layers. It is assumed that the film thickness of a high-acoustic impedance layer indicates the film thickness of the entire multilayer structure.

The film thickness of the low-acoustic impedance layers 4b, 4c, and 4d and the film thickness of the high-acoustic impedance layers 5a, 5b, and 5c are set to increase the reflectance of elastic waves in a frequency band in which a mode used as the main mode of the elastic wave device 1 is excited and to sufficiently reduce leakage of elastic waves to the supporting substrate 2. Because elastic waves excited in the piezoelectric layer 6 are reflected at the boundary surface of each layer in the acoustic reflection layer 3, the energy of elastic waves in each layer in the acoustic reflection layer 3 increases as the layer gets closer to the piezoelectric layer 6.

The piezoelectric layer 6 is preferably made of lithium niobate ($LiNbO_3$), for example, in the present preferred embodiment. Note that the piezoelectric layer 6 may be made of a piezoelectric single crystal, such as lithium tantalate ($LiTaO_3$) other than $LiNbO_3$, or of appropriate piezoelectric ceramics.

The IDT electrode 7 is preferably made of aluminum (Al), for example, in the present preferred embodiment, although there is no particular restriction on the material of the IDT electrode. The IDT electrode 7 may include a single-layer metal film, or may include a multilayer metal film including a plurality of metal layers that are laminated together.

The elastic wave device 1 uses plate waves in the $S_0$ mode as the main mode, although there is no particular restriction on this. Here, a plate wave is a generic term for various waves excited in a piezoelectric layer where, given λ as the wavelength of an excited wave, a film thickness standardized by the wavelength λ is less than or equal to about 1λ. Any structure may be used as long as the waves are concentrated in a piezoelectric layer. That is, the structure may be a membrane structure in which the upper and lower portions of a piezoelectric layer are hollow, and the waves are confined only in the piezoelectric layer, or a structure that reflects elastic waves to at least one of the upper and lower portions of the piezoelectric layer, such as an acoustic reflection layer, may be used. The present application describes a non-limiting example of a structure in which plate waves are confined in a piezoelectric layer using an acoustic reflection layer.

Because $LiNbO_3$ is preferably used as the piezoelectric layer 6 in the elastic wave device 1, the plate wave $S_0$ mode is excited around an acoustic velocity of about 5000 m/s to about 7000 m/s, for example. Here, the acoustic velocity is represented by the product of a frequency at which an elastic wave is excited and the wavelength of the elastic wave. A frequency at which an elastic wave is excited refers to the operating frequency of the elastic wave device 1. In addition, the wavelength of the elastic wave is a length defined by the period of the IDT electrode 7 provided on the surface of the piezoelectric layer 6 in the elastic wave device 1. When the period of electrode fingers in one IDT electrode changes, the average of periods in that IDT electrode defines and functions as the wavelength of elastic waves excited by that IDT. When the piezoelectric layer 6 used in the elastic wave device 1 is made of $LiNbO_3$ and when the above-calculated product of a frequency at which an elastic wave is excited and the wavelength of the elastic wave is about 5000 m/s to about 7000 m/s, for example, it is recognized that the elastic wave device 1 uses the $S_0$ mode.

In addition, when $LiTaO_3$ is used as the piezoelectric layer 6, the $S_0$ mode is excited around an acoustic velocity of about 5000 m/s to about 7000 m/s; and when aluminum nitride (AlN) is used, the $S_0$ mode is excited around 7000 m/s to about 10000 m/s, for example. Therefore, even when the piezoelectric layer 6 is made of any of these materials, if the acoustic velocity calculated by the above method is within the above-described range, it is recognized that the $S_0$ mode is used.

Figure 2:
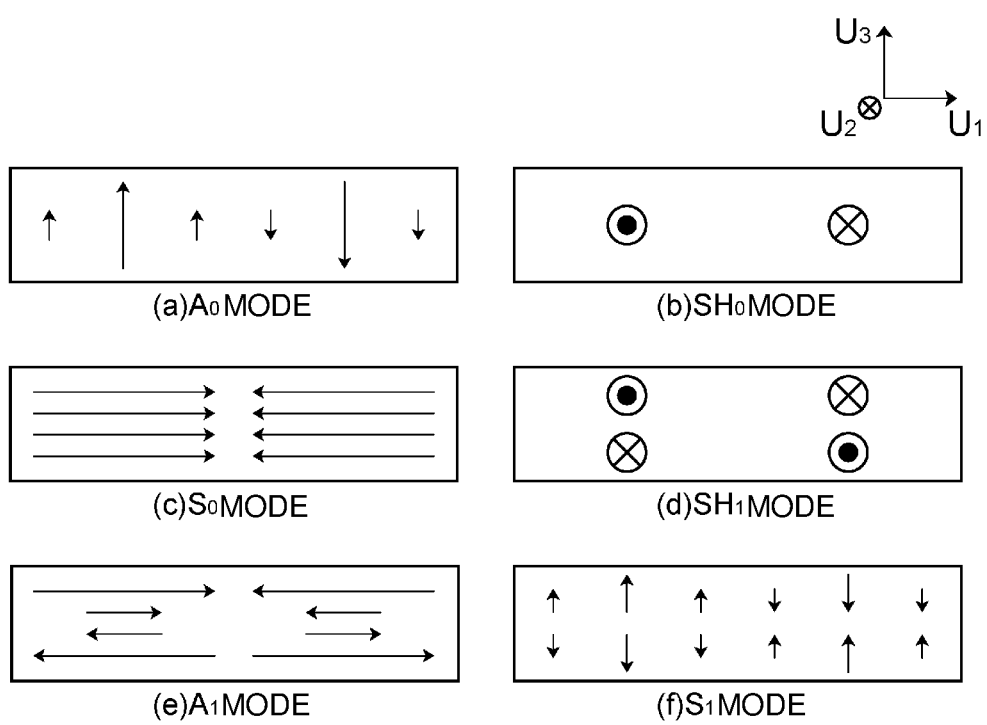
FIG. 2 includes diagrams illustrating exemplary modes of plate wave propagation.

FIG. 2 includes diagrams illustrating exemplary modes of plate wave propagation.

In FIG. 2, the directions of displacement in various modes of plate wave propagation are illustrated. $U_1$ direction, $U_2$ direction, and $U_3$ direction represent a coordinate system; $U_1$ direction and $U_3$ direction have the arrow direction as positive; and $U_2$ direction has the depth direction of the page as positive. $U_1$ direction is a direction in which plate waves propagate. $U_2$ direction is a direction that is parallel or substantially parallel with the main surface of the piezoelectric layer 6 and that is perpendicular or substantially perpendicular to the direction in which plate waves propagate. That is, $U_2$ direction is SH direction. $U_3$ direction is the thickness direction of the piezoelectric layer 6.

As illustrated in FIG. 2, plate waves in the $A_0$ mode, $SH_0$ mode, and $S_0$ mode are generic terms for waves whose main components of displacement are components in $U_3$ direction, $U_2$ direction, and $U_1$ direction, respectively, and that have no node in the thickness direction of the piezoelectric layer. Among modes that have no node in the thickness direction of the piezoelectric layer 6, generally the frequencies are higher in the order of $A_0$ mode, $SH_0$ mode, and $S_0$ mode. In addition, plate waves in the $SH_1$ mode, $A_1$ mode, and $S_1$ mode are modes that have one node in the thickness direction of the piezoelectric layer 6, as illustrated in FIG. 2. Frequencies in these modes are generally higher than those in modes that have no node in the thickness direction of the piezoelectric layer 6, such as the $S_0$ mode.

In the present preferred embodiment, an elastic wave device 1 includes: a supporting substrate 2; an acoustic reflection layer 3 provided on the supporting substrate 2; a piezoelectric layer 6 provided on the acoustic reflection layer 3; and an IDT electrode 7 provided on the piezoelectric layer 6. The acoustic reflection layer 3 includes three or more low-acoustic impedance layers; and two or more high-acoustic impedance layers. A film thickness of, among the three or more low-acoustic impedance layers, a low-acoustic impedance layer 4a positioned nearest to the piezoelectric layer 6 is thinner than a film thickness of a low-acoustic impedance layer closest to the low-acoustic impedance layer 4a among the three or more low-acoustic impedance layers. Accordingly, the difference between the frequency of the main mode and a frequency at which a spurious emission occurs is increased. In other words, the effects of a spurious emission, which may have adverse effects on the filter characteristics of the elastic wave device 1, are able to be reduced or prevented. This point will be described below by comparing the present preferred embodiment and a comparative example.

Here, an elastic wave device of a comparative example is different from the present preferred embodiment in that a plurality of low-acoustic impedance layers all have the same or substantially the same film thickness.

An elastic wave device according to the present preferred embodiment and an elastic wave device of the comparative example are produced to compare the impedance characteristics. The conditions for the elastic wave device according to the present preferred embodiment are as follows. Note that reference is made to the reference numerals in FIG. 1.

Piezoelectric layer 6: material is LiNbO$_3$, film thickness is about 340 nm, and Euler angles (about 90°, about 90°, about 40°);

IDT electrode 7: material is Al, film thickness is about 85 nm, and duty ratio is about 0.5;

Wavelength λ of an elastic wave defined by the pitch of electrode fingers of IDT electrode 7: about 1.7 μm;

Low-acoustic impedance layers 4a to 4d: material is SiO$_2$, and the number of layers is 4;

Film thickness of low-acoustic impedance layer 4a: about 204 nm;

Film thickness of each of low-acoustic impedance layers 4b to 4d: about 272 nm;

High-acoustic impedance layers 5a to 5c: material is Pt, and the number of layers is 3;

Film thickness of each of high-acoustic impedance layers 5a to 5c: about 105 nm; and Supporting substrate: material is Si.

The conditions for the elastic wave device of the comparative example are as follows.

Piezoelectric layer: material is LiNbO$_3$, film thickness is about 340 nm, and Euler angles (about 90°, about 90°, about 40°);

IDT electrode: material is Al, film thickness is about 85 nm, and duty ratio is about 0.5;

Wavelength λ of an elastic wave defined by the pitch of electrode fingers of IDT electrode: about 1.7 μm;

Low-acoustic impedance layers: material is SiO$_2$, and the number of layers is 4;

Film thickness of each low-acoustic impedance layer: about 272 nm;

High-acoustic impedance layers: material is Pt, and the number of layers is 3;

Film thickness of each low-acoustic impedance layer: about 105 nm; and

Supporting substrate: material is Si.

In the comparative example, the film thicknesses of the low-acoustic impedance layers and the high-acoustic impedance layers are set such that the reflectance of elastic waves will be sufficiently high in a frequency band in which the $S_0$ mode used as the main mode is excited. In contrast, in the present preferred embodiment, the film thickness of the low-acoustic impedance layer 4b, 4c, and 4d and the film thickness of the high-acoustic impedance layer 5a, 5b, and 5c are the same or substantially the same as those in the comparative example, and the film thickness of the low-acoustic impedance layer 4a is set to be thinner than the film thickness of all other low-acoustic impedance layers 4b, 4c, and 4d.

Figure 3:
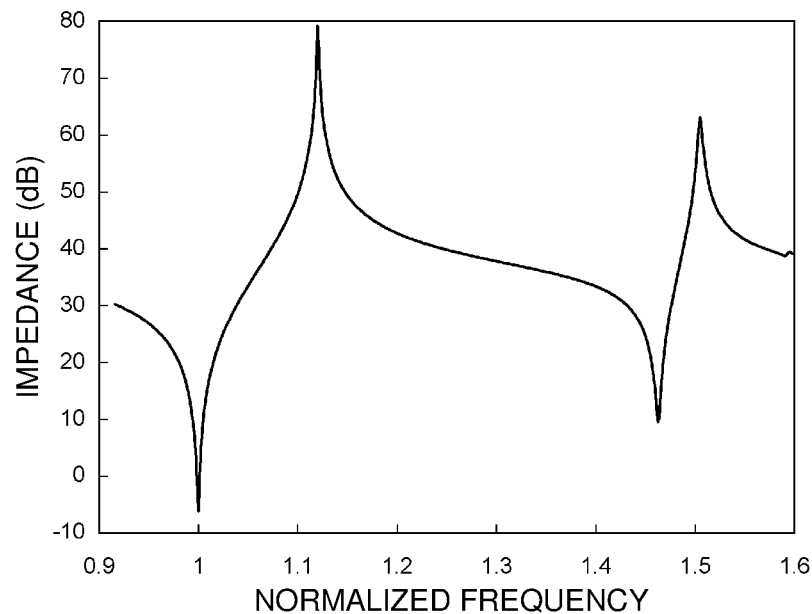
FIG. 3 is a graph illustrating the impedance characteristics of an elastic wave device of a comparative example.

FIG. 3 is a graph illustrating the impedance characteristics of the elastic wave device of the comparative example. The horizontal axis in FIG. 3 is the normalized frequency which standardizes frequencies by the resonant frequency of the So mode which is the main mode.

In the comparative example, points at which the impedance becomes minimum and maximum appear around the normalized frequency of about 1.5, and it is clear that a large spurious emission is occurring. When the difference between a frequency at which a spurious emission occurs and the frequency of the main mode is small, the effect on the filter characteristics of the elastic wave device may be large.

Figure 4:
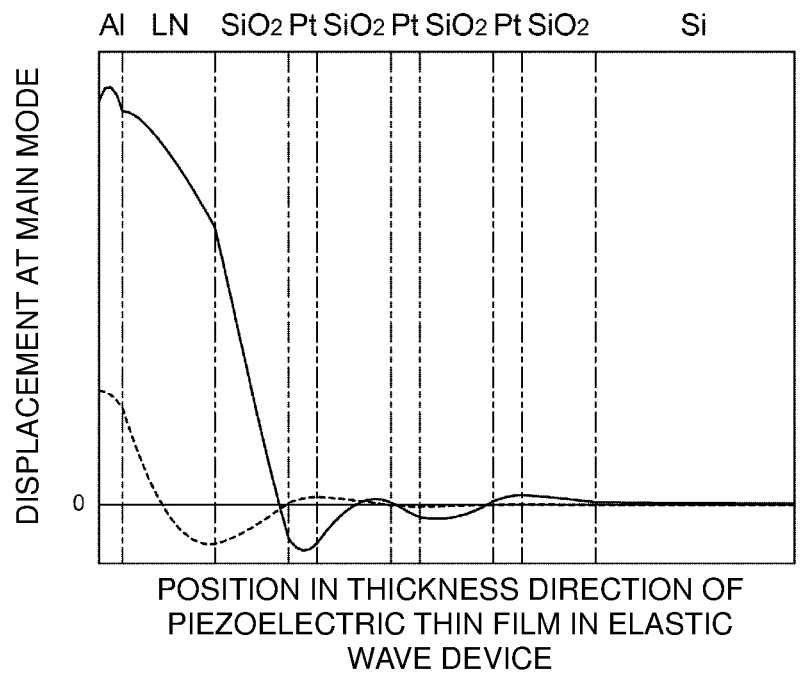
FIG. 4 is a diagram illustrating the distribution of displacement in the thickness direction of a piezoelectric layer at the frequency of the main mode in the comparative example.
Figure 5:
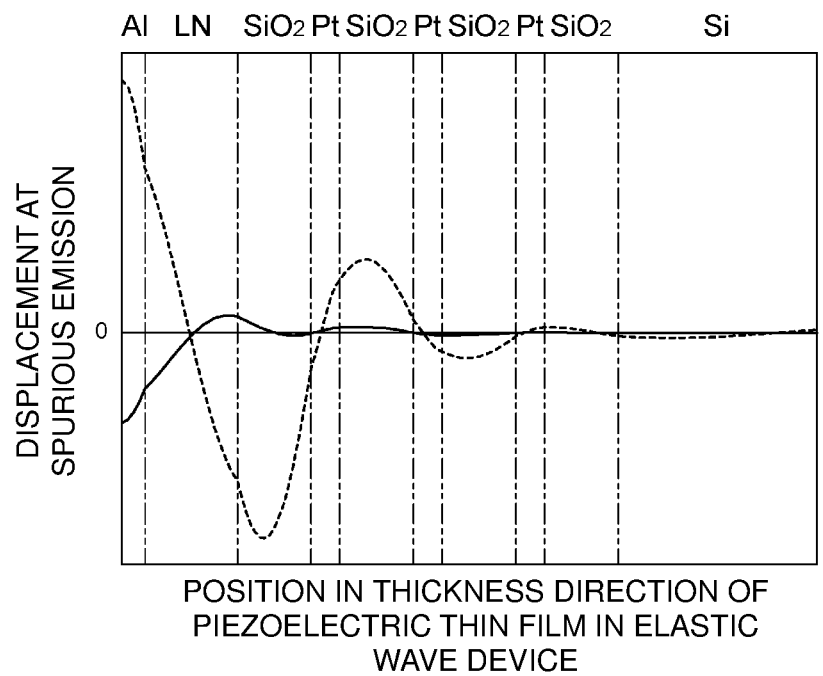
FIG. 5 is a diagram illustrating the distribution of displacement in the thickness direction of the piezoelectric layer at a frequency at which a spurious emission occurs in the comparative example.

In this manner, the distribution of displacement in the thickness direction of the piezoelectric layer at the frequency of the main mode and a frequency at which a spurious emission occurs will be illustrated in FIGS. 4 and 5.

FIG. 4 is a diagram illustrating the distribution of displacement in the thickness direction of the piezoelectric layer at the frequency of the main mode in the comparative example. FIG. 5 is a diagram illustrating the distribution of displacement in the thickness direction of the piezoelectric layer at a frequency at which a spurious emission occurs in the comparative example. A solid line in FIG. 4 represents a component in $U_1$ direction, and a broken line represents a component in $U_2$ direction. Since a component in $U_3$ direction is substantially 0, this component is omitted in FIG. 4. Two-dot chain lines each represent the boundary of a corresponding one of the layers in the elastic wave device. Letters positioned in an upper portion of FIG. 4 represent respective layers in the comparative example. More specifically, Al represents the IDT electrode; LN represents the piezoelectric layer; SiO$_2$ represents each low-acoustic impedance layer; Pt represents each high-acoustic impedance layer; and Si represents the supporting substrate. The same applies to FIG. 5.

As illustrated in FIG. 4, the main mode includes the component in $U_1$ direction as the main component and includes no node at which displacement is zero in the piezoelectric layer. Therefore, the main mode corresponds to the $S_0$ mode illustrated in FIG. 2. In contrast, as illustrated in FIG. 5, the mode of a spurious emission includes the component in $U_2$ direction as the main component and includes one node in the piezoelectric layer. Therefore, the mode of a spurious emission corresponds to the $SH_1$ mode illustrated in FIG. 2. Similarly, in the first preferred embodiment, the main mode is the $S_0$ mode, and the mode of a spurious emission is the $SH_1$ mode.

Figure 6:
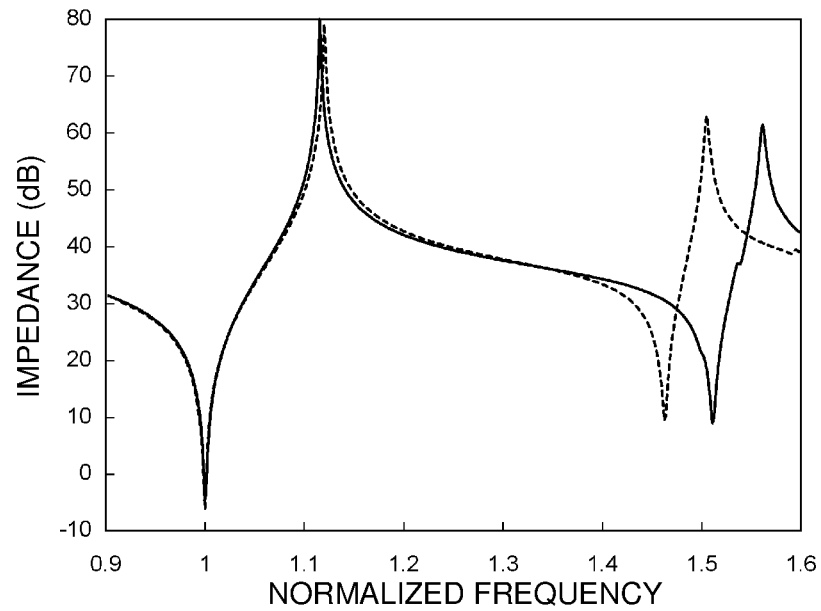
FIG. 6 is a graph illustrating the impedance characteristics of the elastic wave devices of the first preferred embodiment of the present invention and the comparative example.

FIG. 6 is a graph illustrating the impedance characteristics of the elastic wave devices of the first preferred embodiment and the comparative example. As in FIG. 3, the horizontal axis in FIG. 6 is the normalized frequency which standardizes frequencies by the resonant frequency of the main mode for the impedance characteristics in the first preferred embodiment and the comparative example. The resonant frequency of the main mode in the first preferred embodiment is actually lower by about 1% than that in the comparative example. In FIG. 6, the resonant frequencies of the main mode in the first preferred embodiment and the comparative example are aligned and illustrated. Note that a solid line represents the result of the first preferred embodiment, and a broken line represents the result of the comparative example.

As illustrated in FIG. 6, the main modes in the first preferred embodiment and the comparative example substantially overlap. In contrast, it is clear that a frequency at which a spurious emission occurs is higher in the first preferred embodiment than in the comparative example. More specifically, the resonant frequency ratio $F_s/F_m$ of the resonant frequency $F_s$ of a spurious emission to the resonant frequency $F_m$ of the main mode is about 1.464 in the comparative example. In contrast, the resonant frequency ratio $F_s/F_m$ is about 1.512, for example, in the first preferred embodiment. Therefore, the difference between the frequency of the main mode and the frequency at which a spurious emission occurs is increased in the first preferred embodiment than in the comparative example. Thus, the effects of a spurious emission on the filter characteristics of the elastic wave device are able to be sufficiently reduced or prevented. In addition, when the elastic wave device of the first preferred embodiment is commonly connected to an antenna along with another filter, the effects of a spurious emission on the filter characteristics of this other filter is also able to be sufficiently reduced or prevented.

Here, the resonant frequency ratios $F_s/F_m$ are respectively calculated by changing the film thickness of the low-acoustic impedance layer positioned nearest to the piezoelectric layer.

Figure 7:
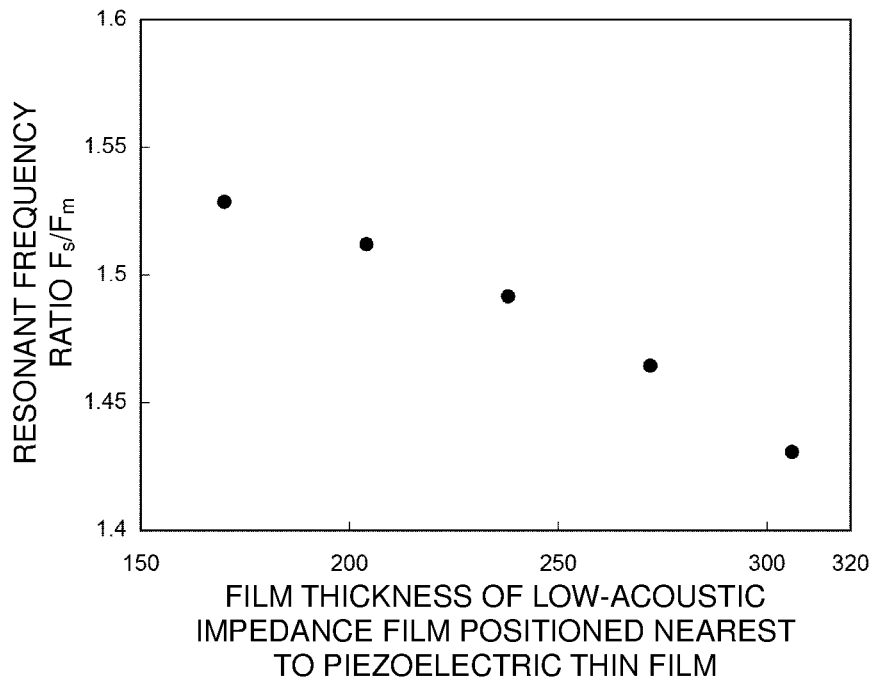
FIG. 7 is a graph illustrating the relationship between the film thickness of a low-acoustic impedance layer positioned nearest to the piezoelectric layer and a resonant frequency ratio $F_s/F_m$ in the first preferred embodiment of the present invention.

FIG. 7 is a graph illustrating the relationship between the film thickness of the low-acoustic impedance layer positioned nearest to the piezoelectric layer and the resonant frequency ratio $F_s/F_m$ in the first preferred embodiment.

As illustrated in FIG. 7, it is clear that the resonant frequency ratio $F_s/F_m$ becomes greater as the film thickness of the low-acoustic impedance layer positioned nearest to the piezoelectric layer becomes thinner.

As has been described above, the mode of a spurious emission in the first preferred embodiment is the $SH_1$ mode. Similar to the $SH_1$ mode, in a mode that includes a node in the thickness direction of the piezoelectric layer and whose displacement varies greatly, characteristic values, such as frequencies, tend to vary in response to the variation of the film thickness of a layer in which there is wave energy, compared to the $S_0$ mode or other modes whose displacement in the thickness direction varies less. Thus, the frequency interval between the $S_0$ mode and the $SH_1$ mode is able to be increased by thinning the film thickness of the low-acoustic impedance layer positioned nearest to the piezoelectric layer in the acoustic reflection layer. In other words, for example, when the film thickness of the low-acoustic impedance layer 4a closest to the piezoelectric layer 6 is thinner than the film thickness of a low-acoustic impedance layer closest to the low-acoustic impedance layer 4a among the other low-acoustic impedance layers, the frequency interval between the $S_0$ mode and the $SH_1$ mode is greater than that in an example of the related art. The example of the related art mentioned here refers to a structure in which all of the low-acoustic impedance layers have the same or substantially the same film thickness.

Among the modes of plate waves illustrated in FIG. 2 that include no node in the thickness direction of the piezoelectric layer, the $S_0$ mode has the highest frequency. Thus, when the $S_0$ mode is used as the main mode, modes causing a spurious emission at higher frequencies are modes that include a node in the thickness direction of the piezoelectric layer, such as the $SH_1$ mode and the $A_1$ mode. Thus, in the case in which a mode other than the $SH_1$ mode, such as the $A_1$ mode, causes a spurious emission, the difference between the frequency of the main mode and a frequency at which a spurious emission occurs is able to be increased by having the same (or similar) configuration for the acoustic reflection layer as that in the first preferred embodiment.

Which mode is excited to cause a spurious emission depends on conditions, such as the type and orientation of the piezoelectric layer, for example. When the $S_0$ mode is used as the main mode, if a spurious emission is caused by a mode other than the $SH_1$ mode, preferred embodiments of the present invention are suitably applicable.

In which manner, the above-described advantageous effects are achieved even by making the film thickness of the piezoelectric layer thinner. In that case, characteristics such as the electromechanical coupling coefficient of the main mode greatly change. In contrast, in the present preferred embodiment, because the film thickness of the low-acoustic impedance layer positioned nearest to the piezoelectric layer is thinner than that of the other low-acoustic impedance layers, the difference between the frequency of the main mode and a frequency at which a spurious emission occurs is increased without greatly affecting the characteristics of the main mode. Even when the film thickness of the low-acoustic impedance layer positioned nearest to the piezoelectric layer is thinner than the film thickness of a low-acoustic impedance layer closest to the foregoing low-acoustic impedance layer among the other low-acoustic impedance layers, the difference between the frequency of the main mode and a frequency at which a spurious emission occurs is greater than that in an example of the related art. The example of the related art mentioned here refers to a structure in which all of the low-acoustic impedance layers have the same or substantially the same film thickness.

In addition, the film thicknesses of the low-acoustic impedance layers other than the low-acoustic impedance layer positioned nearest to the piezoelectric layer and the plurality of high-acoustic impedance layers are set such that the reflectance of elastic waves will be high in a frequency band in which the main mode is excited. Thus, the difference between the frequency of the main mode and a frequency at which a spurious emission occurs is able to be increased without deteriorating the reflection characteristics of the acoustic reflection layer.

Figure 8:
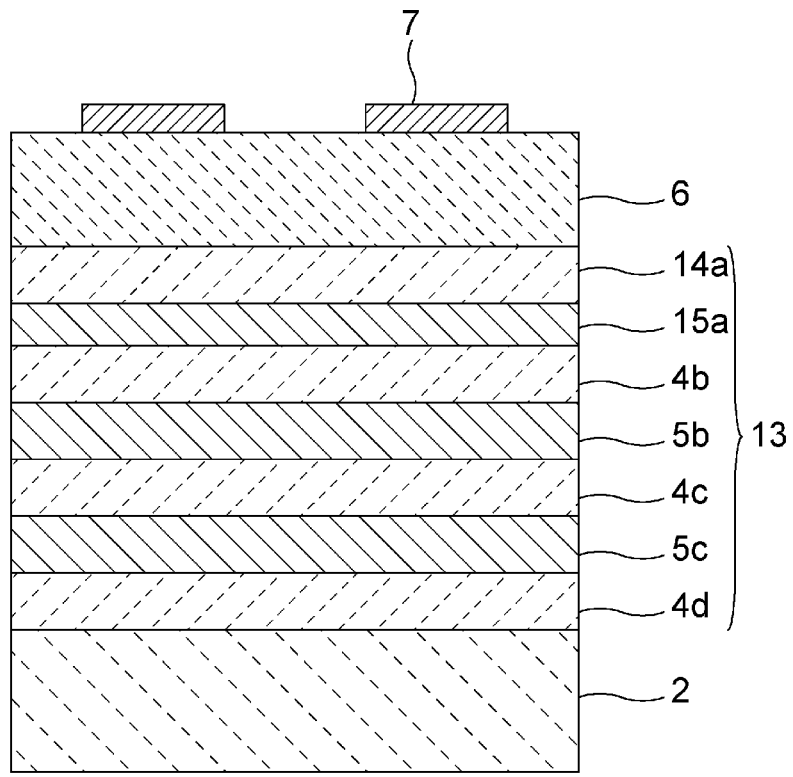
FIG. 8 is a front cross-section of an elastic wave device according to a second preferred embodiment of the present invention.

FIG. 8 is a front cross-section of an elastic wave device according to a second preferred embodiment of the present invention.

The present preferred embodiment is different from the first preferred embodiment in that the film thickness of a high-acoustic impedance layer 15a positioned nearest to the piezoelectric layer 6, among high-acoustic impedance layers, is thinner than the film thickness of all other high-acoustic impedance layers, and that a plurality of low-acoustic impedance layers all have the same or substantially the same film thickness. The elastic wave device of the present preferred embodiment has the same or substantially the same configuration as that of the elastic wave device 1 of the first preferred embodiment except for the above-described aspects.

An elastic wave device with the configuration of the present preferred embodiment and an elastic wave device of a comparative example are produced to compare the impedance characteristics. The conditions for the elastic wave device with the configuration of the present preferred embodiment are as follows.

Piezoelectric layer 6: material is LiNbO$_3$, film thickness is about 340 nm, and Euler angles (about 90°, about 90°, about 40°);

IDT electrode 7: material is Al, film thickness is about 85 nm, and duty ratio is about 0.5;

Wavelength λ of an elastic wave defined by the pitch of electrode fingers of IDT electrode 7: about 1.7 μm Low-acoustic impedance layers 4a to 4d: material is SiO$_2$, and the number of layers is 4;

Film thickness of each of low-acoustic impedance layers 14a and 4b to 4d: about 272 nm;

High-acoustic impedance layers 15a, 5b, and 5c: material is Pt, and the number of layers is 3;

Film thickness of high-acoustic impedance layer 15a: about 88 nm

Film thickness of each of high-acoustic impedance layers 5b and 5c: about 105 nm; and Supporting substrate: material is Si.

The conditions of the elastic wave device of the comparative example are the same or substantially the same as those of the comparative example compared with the first preferred embodiment described above. In the present preferred embodiment, the film thickness of the low-acoustic impedance layer 14a, 4b, 4c, and 4d and the film thickness of the high-acoustic impedance layer 5b and 5c are the same or substantially the same as those in the comparative example, and the film thickness of the high-acoustic impedance layer 15a is set to be thinner than the film thickness of all other high-acoustic impedance layers 5b and 5c.

Figure 9:
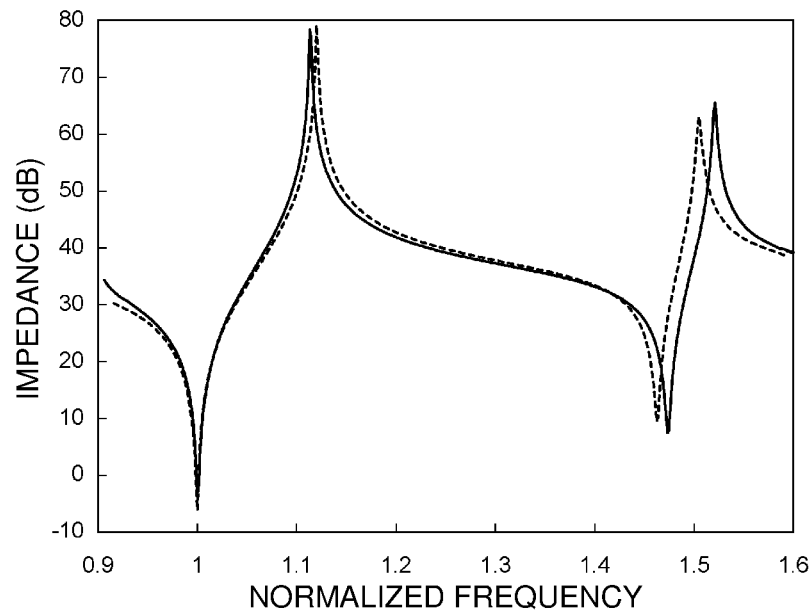
FIG. 9 is a graph illustrating the impedance characteristics of the elastic wave devices of the second preferred embodiment of the present invention and a comparative example.

FIG. 9 is a graph illustrating the impedance characteristics of the elastic wave devices of the second preferred embodiment and the comparative example. As in FIG. 3, the horizontal axis in FIG. 9 is the normalized frequency which standardizes frequencies by the resonant frequency of each main mode for the impedance characteristics in the second preferred embodiment and the comparative example. The resonant frequency of the main mode in the second preferred embodiment is actually lower by about 1% than that in the comparative example. However, in FIG. 9, the resonant frequencies of the main mode in the second preferred embodiment and the comparative example are aligned and illustrated. Note that a solid line represents the result of the second preferred embodiment, and a broken line represents the result of the comparative example.

As illustrated in FIG. 9, the main modes in the second preferred embodiment and the comparative example substantially overlap. In contrast, it is clear that a frequency at which a spurious emission occurs is higher in the second preferred embodiment. More specifically, the resonant frequency ratio $F_s/F_m$ is about 1.464 in the comparative example. In contrast, the resonant frequency ratio $F_s/F_m$ is about 1.473 in the second preferred embodiment, for example. Therefore, the difference between the frequency of the main mode and a frequency at which a spurious emission occurs is greater in the second preferred embodiment than in the comparative example.

Here, the resonant frequency ratios $F_s/F_m$ are respectively calculated by changing the film thickness of the high-acoustic impedance layer positioned closest to the piezoelectric layer.

Figure 10:
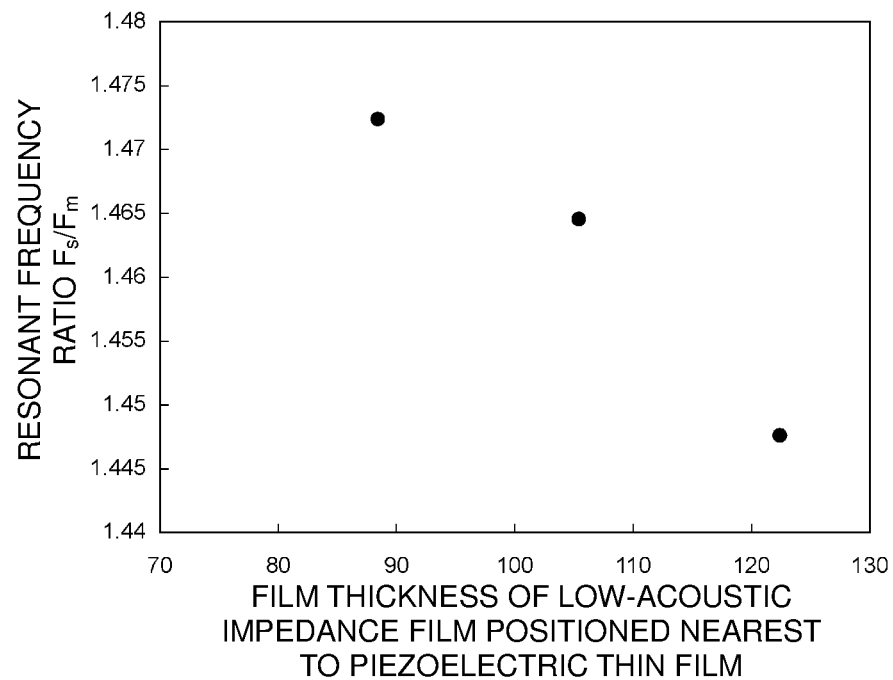
FIG. 10 is a graph illustrating the relationship between the film thickness of a high-acoustic impedance layer positioned nearest to the piezoelectric layer and the resonant frequency ratio $F_s/F_m$ in the second preferred embodiment of the present invention.

FIG. 10 is a graph illustrating the relationship between the film thickness of the high-acoustic impedance layer positioned nearest to the piezoelectric layer and the resonant frequency ratio $F_s/F_m$ in the second preferred embodiment.

As illustrated in FIG. 10, it is clear that the resonant frequency ratio $F_s/F_m$ increases as the film thickness of the high-acoustic impedance layer positioned nearest to the piezoelectric layer decreases.

Note that the mode of a spurious emission in the second preferred embodiment is the SH$_1$ mode. Similar to the SH$_1$ mode, in a mode that includes a node in the thickness direction of the piezoelectric layer and whose displacement varies greatly, characteristic values, such as frequencies, tend to vary in response to the variation of the film thickness of a layer in which there is wave energy, compared to the S$_0$ mode or other modes whose displacement in the thickness direction varies less. Thus, the frequency interval between the S$_0$ mode and the SH$_1$ mode is able to be increased by thinning the film thickness of the high-acoustic impedance layer positioned nearest to the piezoelectric layer in the acoustic reflection layer. In other words, for example, when the film thickness of the high-acoustic impedance layer 15a closest to the piezoelectric layer 6 is thinner than the film thickness of a high-acoustic impedance layer closest to the high-acoustic impedance layer 15a among the other high-acoustic impedance layers, the frequency interval between the S$_0$ mode and the SH$_1$ mode is greater than that in an example of the related art. The example of the related art mentioned here refers to a structure in which all of the high-acoustic impedance layers have the same or substantially the same film thickness.

In this manner, the above-described advantageous effects are achieved even by making the film thickness of the piezoelectric layer thinner. In that case, characteristics, such as the electromechanical coupling coefficient, of the main mode greatly change. In contrast, in the present preferred embodiment, because the film thickness of the high-acoustic impedance layer positioned nearest to the piezoelectric layer is thinner than that of the other high-acoustic impedance layers, the difference between the frequency of the main mode and a frequency at which a spurious emission occurs is able to be increased without greatly affecting the characteristics of the main mode. Even when the film thickness of the high-acoustic impedance layer positioned nearest to the piezoelectric layer is thinner than the film thickness of a high-acoustic impedance layer closest to the high-acoustic impedance layer among the other high-acoustic impedance layers, the difference between the frequency of the main mode and a frequency at which a spurious emission occurs is greater than that in an example of the related art. The example of the related art mentioned here refers to a structure where all the high-acoustic impedance layers have the same or substantially the same film thickness.

In other words, an elastic wave device 1 includes a supporting substrate 2; an acoustic reflection layer 3 provided on the supporting substrate 2; a piezoelectric layer 6 provided on the acoustic reflection layer 3; and an IDT electrode 7 provided on the piezoelectric layer 6. The acoustic reflection layer 3 includes three or more low-acoustic impedance layers; and two or more high-acoustic impedance layers. A film thickness of, among the two or more high-acoustic impedance layers, a high-acoustic impedance layer 15a positioned nearest to the piezoelectric layer 6 is thinner than a film thickness of a high-acoustic impedance layer 5b closest to the high-acoustic impedance layer 15a among the two or more high-acoustic impedance layers. Accordingly, the difference between the frequency of the main mode and a frequency at which a spurious emission occurs is able to be increased. In other words, the effects of a spurious emission, which may have adverse effects on the filter characteristics of the elastic wave device 1, are reduced or prevented.

In the present preferred embodiment, the film thickness of the low-acoustic impedance layer 14a positioned nearest to the piezoelectric layer 6 may be thinner than the film thickness of the low-acoustic impedance layer 4b, the low-acoustic impedance layer 4c, and the low-acoustic impedance layer 4d. In the acoustic reflection layer 13, the film thickness of the low-acoustic impedance layer 14a may be thinner than the film thickness of all the other low-acoustic impedance layers, and the film thickness of the high-acoustic impedance layer 15a may be thinner than the film thickness of all the other high-acoustic impedance layers. In this case, the difference between the frequency of the main mode and a frequency at which a spurious emission occurs is able to be further increased.

In addition, a sufficiently thin adhesion layer preferably made of Titanium (Ti) or other suitable material, for example, may be provided between layers, such as between the supporting substrate and the acoustic reflection layer, between the acoustic reflection layer and the piezoelectric layer, between the piezoelectric layer and the IDT electrode, and between a low-acoustic impedance layer and a high-acoustic impedance layer in the acoustic reflection layer. In addition, a dielectric film structured to adjust characteristics, such as the electromechanical coupling coefficient, may be provided between the piezoelectric layer and the IDT electrode.

The elastic wave devices of each of the preferred embodiments of the present invention may be used as duplexers of RF front-end circuits, for example. This example will be described below.

Figure 11:
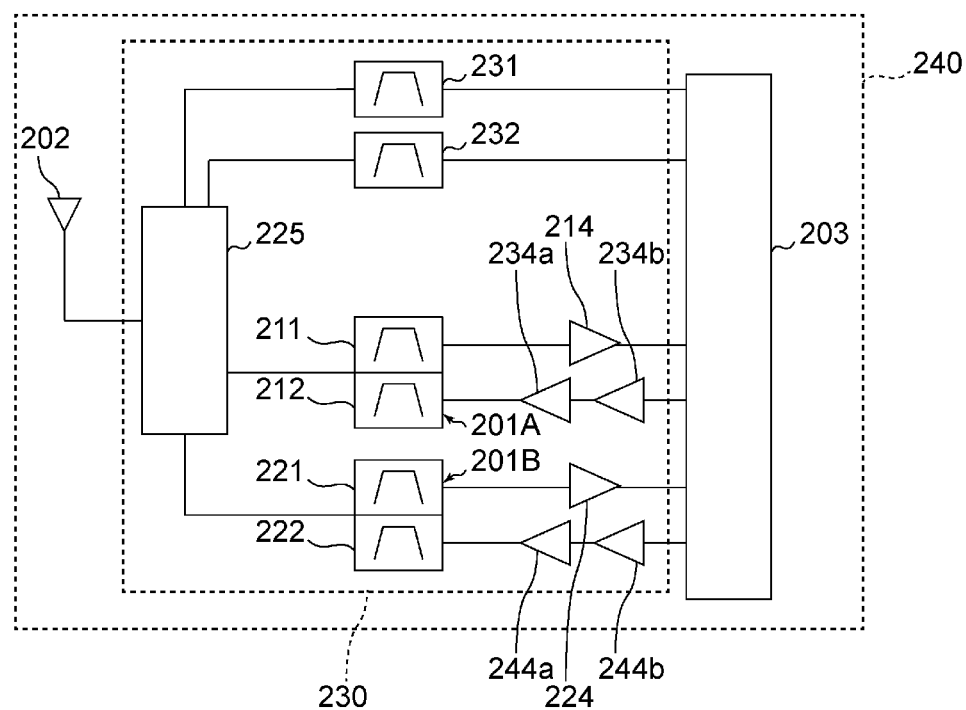
FIG. 11 is a diagram illustrating the configuration of a communication apparatus including an RF front-end circuit.

FIG. 11 is a diagram illustrating the configuration of a communication apparatus and an RF front-end circuit according to a preferred embodiment of the present invention. Note that elements connected to an RF front-end circuit 230, such as an antenna element 202 and an RF signal processing circuit (RFIC) 203, are additionally illustrated in FIG. 11. The RF front-end circuit 230 and the RF signal processing circuit 203 define a communication apparatus 240. Note that the communication apparatus 240 may include a power source, a CPU, and a display.

The RF front-end circuit 230 includes a switch 225, duplexers 201A and 201B, filters 231 and 232, low-noise amplifier circuits 214 and 224, and power-amplifier circuits 234a, 234b, 244a, and 244b. Note that the RF front-end circuit 230 and the communication apparatus 240 in FIG. 11 are only examples of an RF front-end circuit and a communication apparatus, and are not restricted to this configuration.

The duplexer 201A includes filters 211 and 212. The duplexer 201B includes filters 221 and 222. The duplexers 201A and 201B are connected to the antenna element 202 with the switch 225 interposed therebetween. Note that elastic wave devices according to preferred embodiments of the present invention may be used for the duplexer 201A or 201B, or may be the filter 211, 212, 221, or 222.

Furthermore, the elastic wave devices according to preferred embodiments of the present invention are applicable to a multiplexer with three or more filters, such as a triplexer with three filters having commonly-connected antenna terminals, or a hexaplexer with six filters having commonly-connected antenna terminals.

That is, the elastic wave devices according to preferred embodiments of the present invention include elastic wave resonators, filters, duplexers, and multiplexers including three or more filters. The multiplexer is not restricted to a configuration provided with both a transmission filter and a reception filter, and may have a configuration that includes only a transmission filter or a reception filter.

The switch 225 preferably includes a Single Pole Double Throw (SPDT) switch, for example, which connects the antenna element 202 and a signal path corresponding to a certain band in accordance with a control signal from a controller (not illustrated). Note that the number of signal paths connected to the antenna element 202 is not limited to one, but may be plural. In other words, the RF front-end circuit 230 may correspond to carrier aggregation (CA).

The low-noise amplifier 214 is a reception amplifier circuit that amplifies an RF signal (here, an RF reception signal) having gone through the antenna element 202, the switch 225, and the duplexer 201A and outputs the amplified signal to the RF signal processing circuit 203. The low-noise amplifier 224 is a reception amplifier circuit that amplifies an RF signal (here, an RF reception signal) having gone through the antenna element 202, the switch 225, and the duplexer 201B and outputs the amplified signal to the RF signal processing circuit 203.

The power-amplifier circuits 234a and 234b are transmission amplifier circuits that amplify an RF signal (here, an RF transmission signal) output from the RF signal processing circuit 203 and output the amplified signal to the antenna element 202 via the duplexer 201A and the switch 225. The power-amplifier circuits 244a and 244b are transmission amplifier circuits that amplify an RF signal (here, an RF transmission signal) output from the RF signal processing circuit 203 and output the amplified signal to the antenna element 202 via the duplexer 201B and the switch 225.

The RF signal processing circuit 203 performs signal processing on an RF reception signal input from the antenna element 202 via a reception signal path by, for example, down-converting the RF reception signal, and outputs a reception signal generated by the signal processing. In addition, the RF signal processing circuit 203 performs signal processing on an input transmission signal by, for example, up-converting the transmission signal, and outputs an RF transmission signal generated by the signal processing to the power-amplifier circuits 234a, 234b, 244a, and 244b. The RF signal processing circuit 203 is preferably, for example, an RFIC. Note that the communication apparatus 240 may include a baseband (BB) IC. In this case, the BBIC performs signal processing on a reception signal processed by the RFIC. In addition, the BBIC performs signal processing on a transmission signal, and outputs the processed transmission signal to the RFIC. A reception signal processed by the BBIC and a transmission signal before being subjected to signal processing by the BBIC are, for example, image signals or audio signals.

Note that the RF front-end circuit 230 may include duplexers according to modifications of the duplexers 201A and 201B, instead of the duplexers 201A and 201B.

In contrast, the filters 231 and 232 of the communication apparatus 240 are connected between the RF signal processing circuit 203 and the switch 225 without the low-noise amplifier circuits 214 and 224 and the power amplifier circuits 234a, 234b, 244a, and 244b interposed therebetween. Similar to the duplexers 201A and 201B, the filters 231 and 232 are connected to the antenna element 202 with the switch 225 interposed therebetween.

According to the RF front-end circuit 230 and the communication apparatus 240 with the above-described configuration, the difference between the frequency of the main mode and a frequency at which a spurious emission occurs is able to be sufficiently large by providing an elastic wave resonator, a filter, a duplexer, or a multiplexer with three or more filters defined by an elastic wave device according to a preferred embodiment of the present invention.

Although elastic wave devices, RF front-end circuits, and communication apparatuses according to preferred embodiments of the present invention and modifications thereto have been described, the present invention includes other preferred embodiments achieved by combining arbitrary elements in the above-described preferred embodiments and modifications, a modification achieved by applying various modifications conceivable to those skilled in the art to the above-described preferred embodiments without departing from the gist of the present invention, and various devices including RF front-end circuits and communication apparatuses according to preferred embodiments of the present invention.

Preferred embodiments of the present invention may be widely used as elastic wave resonators, filters, duplexers, multiplexers applicable to multiband systems, front-end circuits, and communication apparatuses in communication equipment including cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
   a supporting substrate;
   an acoustic reflection layer provided on the supporting substrate;
   a piezoelectric layer provided on the acoustic reflection layer; and
   an interdigital transducer (IDT) electrode provided on the piezoelectric layer; wherein
   a metal film is not provided between the acoustic reflection layer and the piezoelectric layer;
   the acoustic reflection layer includes:
      three or more low-acoustic impedance layers; and
      two or more high-acoustic impedance layers; and
   at least one of a first relationship in which a film thickness of, among the three or more low-acoustic impedance layers, a first low-acoustic impedance layer closest to the piezoelectric layer is thinner than a film thickness of a low-acoustic impedance layer closest to the first low-acoustic impedance layer among the three or more low-acoustic impedance layers and a second relationship in which a film thickness of, among the two or more high-acoustic impedance layers, a first high-acoustic impedance layer closest to the piezoelectric layer is thinner than a film thickness of a high-acoustic impedance layer closest to the first high-acoustic impedance layer among the two or more high-acoustic impedance layers, is satisfied.

2. The elastic wave device according to claim 1, wherein the three or more low-acoustic impedance layers and the two or more high-acoustic impedance layers are alternately laminated.

3. The elastic wave device according to claim 1, wherein
   a first low-acoustic impedance layer of the three or more low-acoustic impedance layers is closest to the piezoelectric layer; and
   a film thickness of the first low-acoustic impedance layer is thinner than a film thickness of all other low-acoustic impedance layers of the three or more low-acoustic impedance layers.

4. The elastic wave device according to claim 1, wherein
   a film thickness of a first low-acoustic impedance layer of the three or more low-acoustic impedance layers is thinner than a film thickness of all other low-acoustic impedance layers of the three or more low-acoustic impedance layers; and
   a film thickness of a first high-acoustic impedance layer of the two or more high-acoustic impedance layers is thinner than a film thickness of all other high-acoustic impedance layers of the two or more high-acoustic impedance layers.

5. The elastic wave device according to claim 1, wherein a plate wave in $S_0$ mode is used.

6. The elastic wave device according to claim 1, wherein the three or more low-acoustic impedance layers are made of silicon oxide.

7. A radio-frequency (RF) front-end circuit comprising:
   the elastic wave device according to claim 1; and
   a power amplifier.

8. The RF front-end circuit according to claim 7, wherein the three or more low-acoustic impedance layers and the two or more high-acoustic impedance layers are alternately laminated.

9. The RF front-end circuit according to claim 7, wherein
   a first low-acoustic impedance layer of the three or more low-acoustic impedance layers is closest to the piezoelectric layer; and
   a film thickness of the first low-acoustic impedance layer is thinner than a film thickness of all other low-acoustic impedance layers of the three or more low-acoustic impedance layers.

10. The RF front-end circuit according to claim 7, wherein
    a film thickness of a first low-acoustic impedance layer of the three or more low-acoustic impedance layers is thinner than a film thickness of all other low-acoustic impedance layers of the three or more low-acoustic impedance layers; and
    a film thickness of a first high-acoustic impedance layer of the two or more high-acoustic impedance layers is thinner than a film thickness of all other high-acoustic impedance layers of the two or more high-acoustic impedance layers.

11. The RF front-end circuit according to claim 7, wherein a plate wave in $S_0$ mode is used.

12. The RF front-end circuit according to claim 7, wherein the three or more low-acoustic impedance layers are made of silicon oxide.

13. A communication apparatus comprising:
    the radio-frequency (RF) front-end circuit according to claim 7; and
    an RF signal processing circuit.

14. The communication apparatus according to claim 13, wherein the three or more low-acoustic impedance layers and the two or more high-acoustic impedance layers are alternately laminated.

15. The communication apparatus according to claim 13, wherein
    a first low-acoustic impedance layer of the three or more low-acoustic impedance layers is closest to the piezoelectric layer; and a film thickness of the first low-acoustic impedance layer is thinner than a film thickness of all other low-acoustic impedance layers of the three or more low-acoustic impedance layers.

16. The communication apparatus according to claim 13, wherein a film thickness of a first low-acoustic impedance layer of the three or more low-acoustic impedance layers is thinner than a film thickness of all other low-acoustic impedance layers of the three or more low-acoustic impedance layers; and a film thickness of a first high-acoustic impedance layer of the two or more high-acoustic impedance layers is thinner than a film thickness of all other high-acoustic impedance layers of the two or more high-acoustic impedance layers.

17. The communication apparatus according to claim 13, wherein a plate wave in $S_0$ mode is used.

18. The communication apparatus according to claim 13, wherein the three or more low-acoustic impedance layers are made of silicon oxide.

\* \* \* \* \*